(12) United States Patent
Hilt

(10) Patent No.: US 10,324,488 B2
(45) Date of Patent: Jun. 18, 2019

(54) DEVICE TO CONVERT OUT-OF-PLANE MOTION TO IN-PLANE MOTION AND/OR CONVERSELY

(71) Applicant: Commissariat A L'Energie Atomique et aux Energies Alternatives, Paris (FR)

(72) Inventor: Thierry Hilt, Barraux (FR)

(73) Assignee: Commissariat à l'énergie atomique et aux énergies alternatives, Paris France (*) Notice: Subject to any disclaimer, the term of this patent is extended or adjusted under 35 U.S.C. 154(b) by 559 days.

(21) Appl. No.: 14/978,965

(22) Filed: Dec. 22, 2015

(65) Prior Publication Data

US 2016/0195893 A1 Jul. 7, 2016

(30) Foreign Application Priority Data

Dec. 23, 2014 (FR) .................................. 14 63236

(51) Int. Cl.
*G05G 11/00* (2006.01)
*B81B 3/00* (2006.01)
(Continued)

(52) U.S. Cl.
CPC ............ *G05G 11/00* (2013.01); *B81B 3/0051* (2013.01); *H01H 1/0036* (2013.01); *H01L 41/08* (2013.01);
(Continued)

(58) Field of Classification Search
CPC ........... H01L 41/00; H01L 41/04; H02N 2/00; G05G 11/00; B81B 3/0051; B81B 2201/032; H01H 2001/0078
(Continued)

(56) References Cited

U.S. PATENT DOCUMENTS 8,234,951 B1 8/2012 Munoz et al.
8,405,277 B2 * 3/2013 Goyal .................... F03G 7/005
310/300

(Continued)

FOREIGN PATENT DOCUMENTS

EP 1 170 248 A2 1/2002
FR 2 945 835 11/2010
(Continued)

OTHER PUBLICATIONS

French Preliminary Search Report dated Nov. 16, 2015 in French Application 14 63236, filed on Dec. 23, 2014 (with English Translation of Categories of Cited Documents).

*Primary Examiner* — Bryan P Gordon
(74) *Attorney, Agent, or Firm* — Oblon, McClelland, Maier & Neustadt, L.L.P.

(57) ABSTRACT

An actuator comprising two devices each comprising an out-of-plane deformable element, said deformable element comprising a first fixed end anchored on a substrate and a second free end relative to the substrate, said device also comprising means to guide the second free end in in-plane translation along a first direction, the first deformable element being capable of deforming out-of-plane through application of a stimulus so that the second free end draws close to the first fixed end following in-plane translational movement. The actuator also comprises an element mobile in rotation about an axis orthogonal to the plane and mechanically linked to the free ends of the deformable elements, and a translationally mobile element mechanically linked to the rotationally mobile element.

23 Claims, 7 Drawing Sheets

(51) Int. Cl.
　　　*H01H 1/00*　　　(2006.01)
　　　*H01L 41/08*　　　(2006.01)
(52) U.S. Cl.
　　　CPC ... *B81B 2201/032* (2013.01); *B81B 2201/037* (2013.01); *B81B 2203/051* (2013.01); *H01H 2001/0078* (2013.01)
(58) Field of Classification Search
　　　USPC .......................................................... 310/311
　　　See application file for complete search history.

(56) References Cited

U.S. PATENT DOCUMENTS

| | | | | |
|---|---|---|---|---|
| 2009/0261688 | A1* | 10/2009 | Xie | B81B 3/0035 |
| | | | | 310/307 |
| 2012/0279838 | A1 | 11/2012 | Lai et al. | |
| 2014/0092492 | A1* | 4/2014 | Topliss | G02B 7/08 |
| | | | | 359/823 |
| 2014/0146435 | A1* | 5/2014 | Stephanou | H01G 5/18 |
| | | | | 361/290 |

FOREIGN PATENT DOCUMENTS

| | | |
|---|---|---|
| JP | 6-160750 | 6/1994 |
| WO | WO 02/04991 A2 | 1/2002 |
| WO | WO 2010/136470 A2 | 12/2010 |

\* cited by examiner

DEVICE TO CONVERT OUT-OF-PLANE MOTION TO IN-PLANE MOTION AND/OR CONVERSELY

TECHNICAL FIELD AND STATE OF THE PRIOR ART

The present invention relates to a device to convert out-of-plane motion to in-plane motion and/or to convert in-plane motion to out-of-plane motion, in particular in microsystems or nanosystems, and to an actuator comprising said device.

In MicroElectroMechanical Systems (MEMS) and/or NanoElectroMechanical Systems (NEMS) it is sought to produce microactuators and/or nanoactuators to set objects in motion, for example to obtain microswitches. It is more particularly sought to produce actuators in the plane of the MEMS and/or NEMS.

Actuators of electrostatic type exist comprising a fixed comb and mobile comb having interdigitated fingers and between which a voltage difference is applied causing the onset of electrostatic forces which tend to draw the fingers together and thereby set the mobile comb in motion. This type of actuator has the advantage of providing in-plane actuation but the disadvantage of only having limited energy to carry out actuation on a given device surface area.

Actuators also exist which use electroactive material such as piezoelectric materials. For example, the actuator comprises an overhanging beam of cantilever type one end of which is anchored on a substrate and receives said piezoelectric material deposit. When an electric current passes through the piezoelectric material, the material contracts causing out-of-plane bending of the beam, its free end drawing away from or drawing close to the substrate. Said actuator has sufficient energy but it is an out-of-plane actuator.

DISCLOSURE OF THE INVENTION

It is therefore one objective of the present invention to provide a novel device to convert out-of-plane motion to in-plane motion and/or conversely, and more particularly to provide an in-plane actuator.

The above-stated objective is reached with a device to convert out-of-plane motion to in-plane motion and/or conversely comprising at least one element able to deform out-of-plane when a stimulus is applied thereto, the deformable element comprising one end anchored on a substrate and one end free relative to the substrate, and means to guide the free end in translation, guidance being in-plane.

In other words, at least one element of cantilever type is used that is caused to deform out-of-plane by compelling its free end to move in in-plane translation. Therefore, the element of cantilever type when it is deformed forces its free end to move towards the anchored end whilst remaining in-plane. It is possible for example to obtain an in-plane translation actuator, the direction of translation being parallel to the direction containing the anchored end and the free end. Conversely, by moving the free end in-plane it is possible to obtain out-of-plane deformation of the cantilever type element.

In one particularly advantageous example, the device comprises an element mobile in rotation about an axis perpendicular to the plane, which is mechanically connected to two deformable elements so that, when a stimulus is applied to one of the deformable elements, this element deforms out-of-plane and the free end moves in-plane being drawn towards the anchored end which causes rotation of the mobile element. Therefore by alternately applying electric potentials to the two deformable elements, movement in rotation is obtained either side of an equilibrium position.

With a MEMS device the equilibrium position is the fabrication position of the MEMS.

In one example of embodiment, an element guided in translation is mechanically connected to the rotationally mobile element so that the movement in rotation of the mobile element causes translational movement of the translationally mobile element. For example, the direction of the translationally mobile element is perpendicular to the direction comprising the anchored end and the free end of the deformable elements.

The deformable element can be of bimetallic type, the deformable element containing an electroactive material which contracts when an electric field is applied thereto, or if the deformable element contains two materials having different thermal expansion coefficients, the element bends when heated beyond a given temperature.

The motion converting device can be used to obtain an actuator or an energy recovery device.

The subject-matter of the present invention is therefore a device to convert out-of-plane motion to in-plane motion and/or conversely comprising at least one first out-of-plane deformable element, said deformable element comprising a first fixed end anchored on a substrate and a second end free relative to the substrate, said device also comprising means to guide in translation the second free end in-plane along a first direction, the first deformable element able to be deformed out-of-plane by applying a stimulus so that the second free end is drawn towards the first fixed end via in-plane translational movement.

The first deformable element may be a membrane.

The guide means are formed for example of deformable beams extending perpendicular to the first direction. The beams are advantageously at least able to be deformed by flexion.

Preferably, the means capable of applying the stimulus/stimuli apply stimulus/stimuli without contacting the deformable element(s).

In one example of embodiment, the first deformable element is a bimetallic element and the stimulus is the application of heat.

In another example of embodiment, the first deformable element comprises a deposit of electroactive material and the stimulus is the application of an electric field to said deposit. The electroactive material may be a piezoelectric material and the electric field can be generated by electrodes arranged either side of and/or coplanar with said deposit of piezoelectric material.

A further subject-matter of the present invention is a system comprising at least one device of the invention and an element mobile in rotation about a rotational axis orthogonal to the plane, said rotationally mobile element being mechanically linked to the second free end of the deformable element so that when at least one stimulus is applied to the deformable element, the rotationally mobile element is set in rotation about the rotation axis.

A further subject-matter of the invention is a system comprising at least two devices of the invention and an element mobile in rotation about a rotation axis orthogonal to the plane. The deformable element of each device is able to deform out-of-plane by application of a stimulus independent of the stimulus applied to the other deformable element.

The system of the invention allows the rotationally mobile element to be rotated about a neutral position.

A further subject-matter of the invention is a system comprising at least two devices of the invention and an element mobile in rotation about a rotation axis orthogonal to the plane. The two second free ends can be guided along the first direction and the rotationally mobile element can be mechanically linked to the second free ends of the two deformable elements of said devices.

A further subject-matter of the present invention is a system comprising at least two devices of the invention and an element mobile at least in rotation about a rotation axis orthogonal to the plane. The free end of one of the devices can be guided along the first direction whilst the free end of the other of the devices can be guided along another direction contained in said plane and non-collinear with the first direction. The rotationally mobile element is mechanically linked to the free ends of the deformable elements of said devices.

The rotationally mobile element is mechanically linked for example to the free ends of the deformable elements via flexible beams.

The system may also comprise an in-plane translationally mobile element mechanically linked to the rotationally mobile element so that rotation of the rotationally mobile element causes in-plane translation of the translationally mobile element.

The system advantageously comprises means to guide the translationally mobile element in in-plane translation.

The means to guide in translation the translationally mobile element can guide the translationally mobile element in a direction orthogonal to the first direction. The rotationally mobile element can be mechanically linked to the translationally mobile element via flexible beams.

The rotationally mobile element is positioned for example between the two deformable elements, and the translationally mobile element is in the form of a frame surrounding the two deformable elements, the rotationally mobile element being hinged on an inner edge of the frame-shaped element that is mobile in translation.

A further subject-matter of the present invention is an actuator comprising at least one conversion device of the invention or at least one system of the invention and a control unit sending a stimulus to the device(s).

A further subject-matter of the invention is an actuator comprising at least one system of the invention and a control unit sending a stimulus to each of the devices, the stimuli being phase shifted by ii.

A further subject-matter of the invention is a translation actuator comprising at least one system of the invention and a control unit sending a stimulus to each of the devices.

According to one additional characteristic the stimulus is sinusoidal.

A further subject of the invention is a compressor comprising a cavity, a piston mobile inside the cavity, at least two translation actuators according to the invention, each of the pistons being mechanically linked to an element mobile in translation so that the relative displacement of the pistons generates a pressure increase inside the cavity.

The first and second pistons advantageously have a coiled conformation and are imbricated one in the other to create pockets of fluid between the coil turns.

A further subject-matter of the invention is an energy recovery system comprising an energy recovery element comprising at least one conversion device of the invention or at least one system of the invention and a unit collecting the electric current generated by said device or said system.

Energy can be recovered using deformation of the membrane in particular when it contains a piezoelectric material. Deformation of the membrane generates a difference in electric potential in the electrodes associated with the piezoelectric material, of which use can be made.

BRIEF DESCRIPTION OF THE DRAWINGS

The present invention will be better understood on the basis of the following description and appended drawings in which.

DETAILED DESCRIPTION OF PARTICULAR EMBODIMENTS

In the following description the device to convert out-of-plane motion to in-plane motion and/or conversely is described with application to an actuator. However, the present invention is not limited to application to an actuator but extends to any device able to implement said motion conversion.

In the present application by "deformable element" is meant an element having an initial configuration and which can be elastically deformed by application of a stimulus e.g. under strain resulting from heating or the application of an electric or magnetic field or application of an acceleration. The deformable element resumes its initial configuration when no longer constrained.

Also, when reference is made to the plane, the plane is the median plane of the device parallel to the plane of the substrate.

Figure 1A:
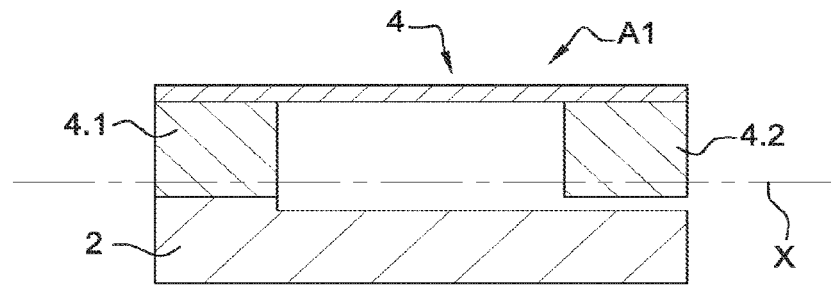
FIGS. 1A and 1B are schematic illustrations giving a side view of an example of a motion conversion device at rest and in actuation state.
Figure 1B:
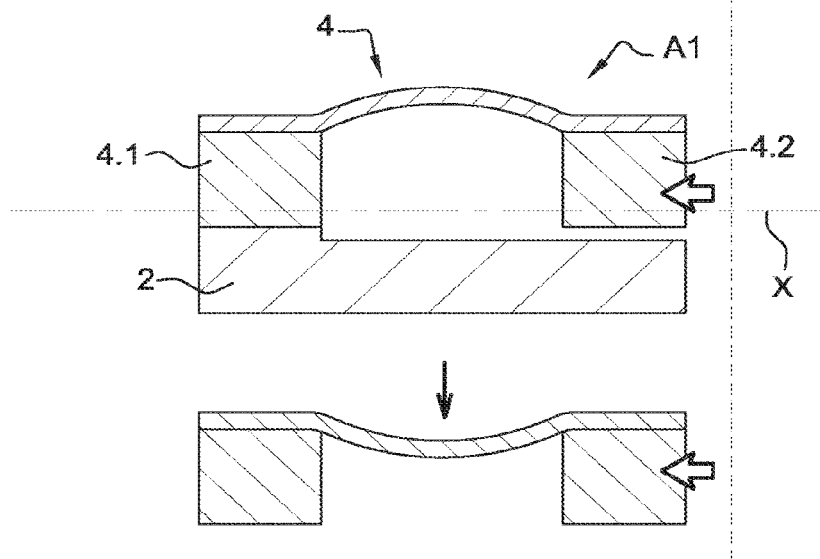
Figure 1C:
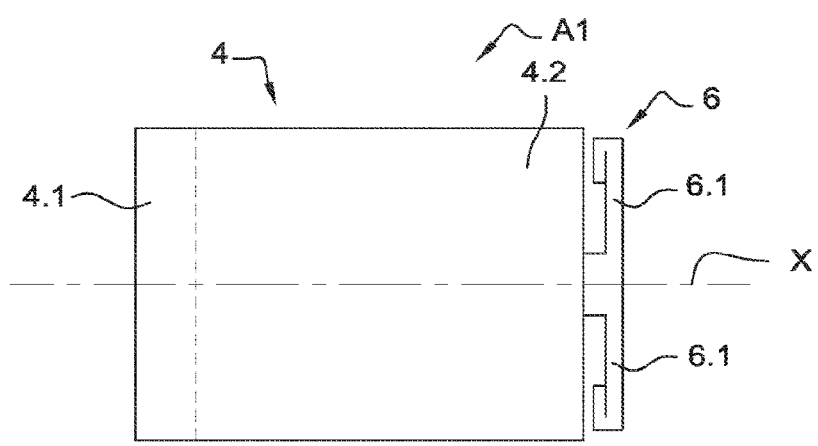
FIG. 1C is an overhead view of a practical example of embodiment of the device in FIGS. 1A and 1B.

FIGS. 1A to 1C show an example of an actuator A1 of the invention comprising a substrate 2 and a deformable element 4 extending in a direction X contained in the plane of the substrate. The deformable element 4 comprises a first end 4.1 anchored on the substrate, called a fixed end, and a second end 4.2 that is free relative to the substrate 2, called free or mobile end. By "free end relative to the substrate" is meant an end able to be displaced relative to the substrate; this displacement may or may not be limited. The fixed end 4.1 and the free end 4.2 are aligned in direction X.

The deformable element is a beam for example or more advantageously a membrane as illustrated in FIG. 1C, capable of out-of-plane deformation under application of a stimulus. In the remainder of the description, the deformable element shall be designated a "membrane".

For example the membrane is a bimetallic element and the stimulus is applied heat causing bending of the bimetallic element for as long as the bimetallic element is no longer at rest temperature. A bimetallic element is formed of two strips in different materials having different expansion coefficients, the two strips being joined by rolling, welding, gluing, brazing or directly by deposit e.g. by direct sputtering of a second material on a first material to form a heterogeneous, monolithic element.

Alternatively and preferably, the membrane comprises a suspended support layer and at least one layer of electroactive material e.g. piezoelectric material which deforms when subjected to an electric field. A layer of electroactive material can be formed on one of the sides of the support layer. Since the piezoelectric material is deformed on the membrane which is not deformed, a bimetallic effect happens and causes bending of the membrane-piezoelectric material assembly. The direction of bending of the piezoelectric material varies according to the direction of the electric field. The same applies to a thermal bimetal: according to whether the temperature is above or below a reference temperature the direction of bending changes. The electric field is generated by electrodes arranged on and either side of and/or coplanar with the deposit of piezoelectric material. The shape of the deformed membrane has two inflection points. In other words the membrane has one curvature in one direction at its centre and curvatures in the other direction in the vicinity of its fixation points. The energy developed by the electroactive material being directly dependent upon the volume of active material, it is preferable to deposit a large amount of material. It is therefore advantageous to deposit electroactive material on all the areas where bending can be caused, for example in the centre and on the edges of the membrane. Since the directions of bending are reversed between the centre and the edges, by selecting materials having symmetric behaviour as a function of their polarisation by this electric field and by subjecting the electroactive material(s) positioned in the centre and on the edges to opposite electric fields, the benefit is obtained of a large amount of electroactive material having the same direction of bending irrespective of its position on the membrane.

The actuator A1 also comprises guide means 6 illustrated in FIG. 1C to guide the free end of the membrane in in-plane translation.

Advantageously, in a microactuator or nanoactuator as illustrated in FIG. 1C, the guide means are formed by beams 6.1 capable of deforming via in-plane flexion. In the illustrated example, two pairs of guide beams are used extending perpendicular to the axis of direction X. In this example, the guide beams also form beams to suspend the free end relative to the substrate.

A description is now given of the functioning of the actuator A1.

The case is considered of actuation using an electroactive material. When no electric field is applied the membrane is planar (FIGS. 1A and 1C).

When an electric field is applied to the electroactive material, the membrane bends. Since it is anchored on the substrate via its fixed end 4.1, it is the free end which moves. The beams 6 bend under the pulling force applied by the free end 4.2 of the membrane. The beams guide the free end 4.2. In in-plane translation forcing this end to move in-plane in direction X. On account of bending of the membrane, the free end 4.2 is drawn towards the fixed end 4.1.

In this manner a simple actuator is provided providing sufficient energy. More generally, a device is produced allowing conversion of the out-of-plane motion of the membrane to in-plane translational movement of the free end and/or conversely.

The actuator A1 can be used for example for very accurate aligning of objects such as the ends of optical fibres for example. A fixed optical fibre can be envisaged and an optical fibre having one end joined to the free end of the membrane. By actuating the membrane it is possible to align or not align the two optical fibres. An optical switch is thereby obtained and it is possible for example to form a router. This example is in no way limiting.

In the illustrated example, the membrane is deformed with its bending oriented downwards. As explained above, by changing the polarisation of the layer of electroactive material on the membrane, the orientation of the concavity is modified. However the direction of movement of the free end is still towards the free end.

In FIGS. 2 to 5 another example of embodiment is given of an actuator A2 allowing translational movement in a direction perpendicular to direction X.

The actuator A2 comprises two actuators A1 side by side and parallel i.e. the membranes 4, 104 extend along a direction parallel to direction X.

The actuator A2 also comprises a first element 8 mobile in rotation about an axis Z orthogonal to the plane. It is arranged between the two membranes 4, 104. The first mobile element 8 extends along direction X. The mobile element is mechanically linked to the free ends 4.2, 104.2 of each of the membranes 4, 104. More specifically, the mobile element 8 comprises a lateral surface 10 connected via a mechanical link 12 to the free end 4.2 and an opposite lateral surface 14 connected via a mechanical link 16 to the free end 104.2. The mechanical links 12 and 16 are able to deform in a direction transverse to direction X. The mechanical links 12 and 16 advantageously each comprise two beams able to deform extending parallel to axis X extending either side of the free end.

The actuator A2 also comprises a second mobile element 18 guided in translation along direction Y, this element extending along direction Y. Five degrees of freedom of the second mobile element 18 are blocked. The means for guiding the second mobile element in translation are of the same type for example as those to guide the free ends of the membranes i.e. they comprise beams able to deform by flexion.

The second mobile element 18 is connected via a mechanical link 20 to one end 8.1 of the first mobile element 8 positioned outside the area delimited between the two membranes 4, 104. The mechanical link 20 is capable of deforming along direction X. In the illustrated example the mechanical link 20 is substantially in the centre of the second mobile element, but a mechanical link 20 in another part of the second mobile element does not depart from the scope of the present invention.

The two actuators A1 are actuated with a phase shift of π. The signals applied to the membranes 4, 104 as a function of time t are illustrated in the graph in FIG. 10. Signal S1 is the signal applied to membrane 4 and signal S2 is the signal applied to membrane 104. In the illustrated example, the signals are sinusoidal. But it could be envisaged that they have a different form e.g. they could be square-wave.

Figure 2:
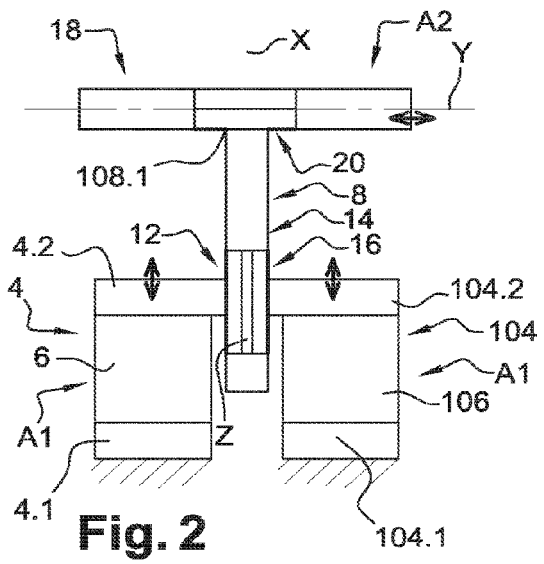
FIG. 2 is a schematic overhead view illustrating another example of embodiment of a motion conversion device at rest.

In the configuration in FIG. 2, no signal is applied to the membranes, they are at rest.

Movements vary between a negative extreme denoted −1 and 0, the value −1 corresponding to maximum deformation of the membrane and value 0 corresponding to no deformation of the membrane.

Figure 3:
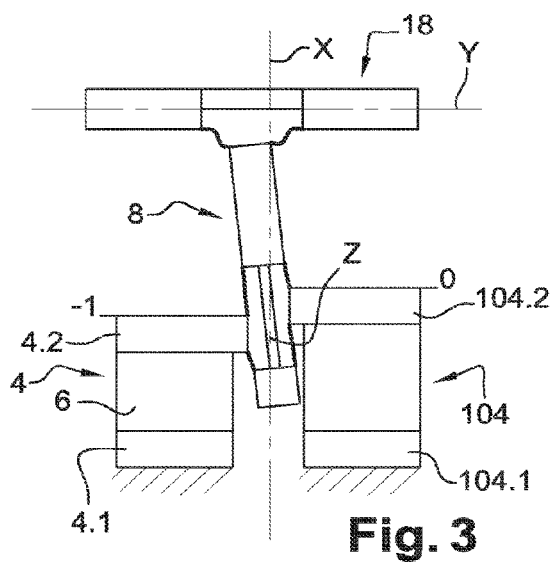
FIG. 3 is a schematic illustration of the device in FIG. 2 in a first state of actuation.
Figure 10:
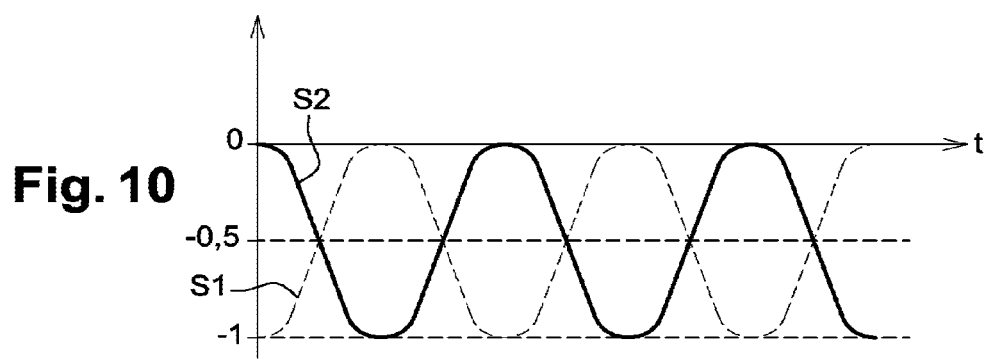
FIG. 10 is a graphic illustration of the signals applied to the membranes 4, 104 of the actuator of the device in FIGS. 2 to 5.

A t=0 in the graph in FIG. 10, signal S1 is at −1, the membrane 4 is bended; signal S2 is at 0, the membrane 104 is at rest, it is planar. The free end 4.2 moves in translation along direction X towards the fixed end 4.1. This state is illustrated in FIG. 3. On account of the link 12 between the lateral surface 10 of the first mobile element 8 and the free end 4.2 of the membrane, the first mobile element pivots on the side of the membrane 4 about an axis Z perpendicular to the plane. The beams of links 12 and 16 are deformed.

Figure 4:
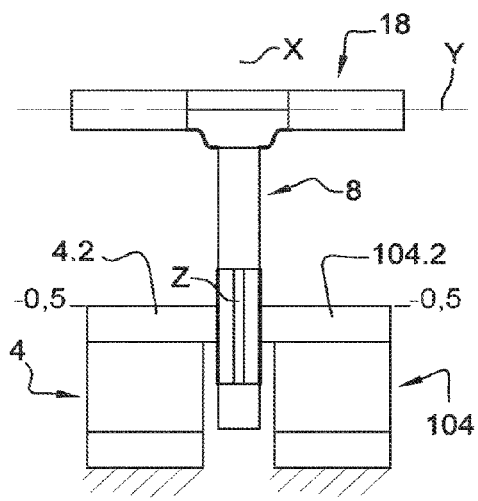
FIG. 4 is a schematic illustration of the device in FIG. 2 in a second state of actuation.

A t=1 in the graph in FIG. 10, signal S1 is at −0.5 and signal S2 is at −0.5, the two membranes 4, 104 have the same intermediate curvatures, the first mobile element 8 then undergoes a traction force by the free end 104.2 of membrane 104 whilst the traction force applied by the free end 4.2 of membrane 4 on the first element 8 is reduced. The first mobile element 8 resumes a position aligned with axis X (FIG. 4). The connection between the first mobile element 8 and the second mobile element 18 is formed by beams extending along axis Y, therefore the second mobile element 18 can be at position 0 whereas membranes 4 and 104 are at position −0.5.

Figure 5:
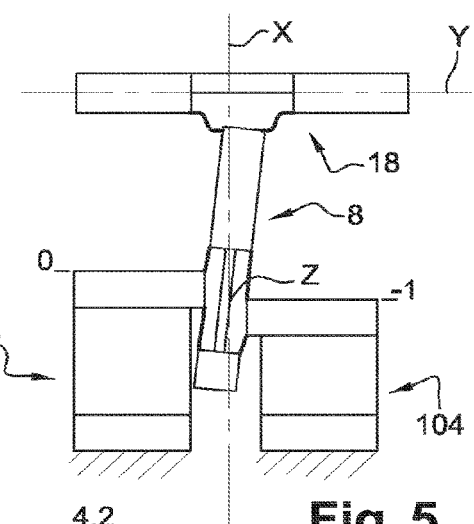
FIG. 5 is a schematic illustration of the device in FIG. 2 in a third state of actuation.

At t=2, signal S2 is at −1, membrane 104 is bended; signal S1 is at 0, membrane 4 is at rest, it is planar. The free end 104.2 moves in translation along direction X towards the fixed end 104.1. This state is illustrated in FIG. 5. On account of the link 16 between the lateral surface 14 of the first mobile element 8 and the free end 104.2 of membrane 104, the first mobile element 8 pivots towards the membrane 104 about axis Z. The beams of links 12 and 16 become deformed.

The rotational movement about axis Z of the first mobile element 8 continues for as long as signals S1 and S2 are applied, the first mobile element 8 then has oscillating movement about axis Z and the end 8.1 of the first mobile element moves alternately either side of axis X.

The second mobile element 18 guided in translation along axis Y, on account of pivoting of the first mobile element 8, is moved in translation. It moves alternately to the left and right as shown in the illustrations in FIGS. 3 and 4. The second mobile element 18 therefore has oscillating movement in translation along axis Y either side of a neutral position.

In this manner a translational actuator is obtained.

It will be understood that the second mobile element could be guided in translation along a direction which is not necessarily perpendicular to axis X.

As another variant, a rotational actuator could be obtained, the second mobile element being omitted and movement being recovered directly on the first mobile element 8.

As a further variant, the actuator A2 could only have one actuator A1 and the lateral edge 14 of the first mobile element 8 could be connected to the substrate. The angular clearance of the first mobile part would be divided by two as would be the axial clearance of the second mobile element.

The shape of the first mobile part 8 may differ from the one shown in FIGS. 2 to 5. It could be chosen so that the widest and shortest membranes can be used to reduce risks of buckling.

The use of the first rotationally mobile element 8 offers the advantage of providing amplification of movement through the difference in lever arms. It is thus possible to obtain an actuator causing relatively large amplitude of movement along axis Y despite reduced amplitude of movement of the free ends of the membranes along X and reduced amplitude of angular displacement of the first mobile element since the amplitude of movement along X is proportional to the length of the lever arm.

In addition, this actuator can most advantageously be fabricated using microelectronic processes of machining and planar deposits.

If the actuator comprises several motion conversion devices, the guiding of the free ends may possibly not be in co-linear directions. As a result, in addition to rotation of the mobile element, the system may allow translational movement of this element to be obtained in said plane depending on the applied signal.

Figure 6:
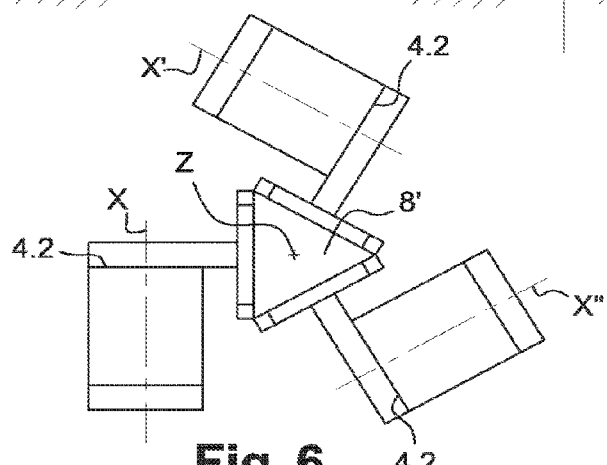
FIG. 6 is a schematic illustration of an actuator comprising three motion conversion devices.

In FIG. 6 an example of embodiment can be seen of an actuator having three devices similar to actuator A1. In the illustrated example, the three devices are arranged at 120° to one another. Each free end 4.2 of the devices is connected to a mobile element 8' in the form of a plate intended to be set in movement and hence by the devices. The free ends 4.2 of the devices are guided in translation along secant directions X, X', X". In the illustrated example they form an angle of 120° between each other. The ends 4.2 of the actuators are connected to the plate 8' by beams for example that can deform by flexion.

Therefore by actuating the three devices simultaneously the plate 8' is set in rotation about axis Z. By actuating one or two devices the plate 8' is moved in rotation and in translation.

A system comprising more than three motion conversion devices does not depart from the scope of the present invention.

Figure 7:
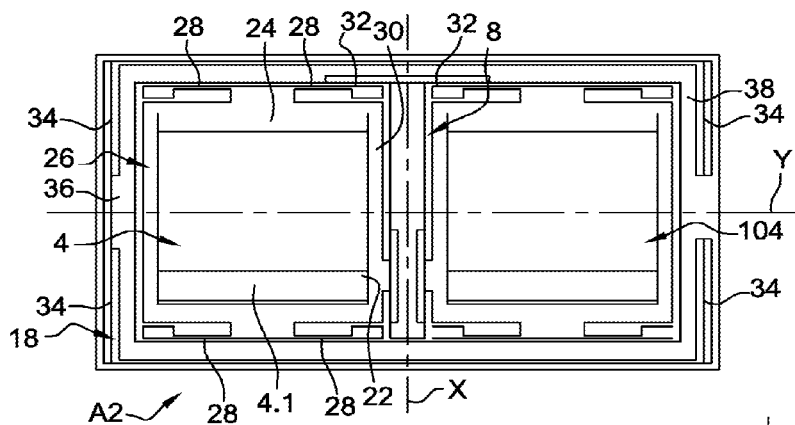
FIG. 7 is an overhead view of a practical embodiment of a motion conversion micro-device.

In FIG. 7 an overhead view can be seen of a practical example of embodiment of actuator A2 obtained using microelectronic processes.

The references used to describe FIGS. 2 to 5 will be reproduced for the description of FIG. 7 to designate elements having the same function.

FIG. 7 shows two actuators A1 side by side each comprising a membrane 4, 104 having a dimension along direction X that is advantageously smaller than the dimension along direction Y to reduce risks of buckling.

Since both actuators are of similar structure only one thereof will be described in detail.

The fixed end 4.1 of the membrane 4 is anchored on the substrate via an anchor pad 22 extending over the entire width of the membrane, and the free end 4.1 of the membrane comprises a transverse element 24 extending over the entire width of the membrane. The transverse element 24 is similar to the anchor pad except that it is only joined to membrane 4. The transverse element 24 provides cross-stiffness in the plane of the free end of the membrane.

The actuator also comprises a rigid frame 26 surrounding the membrane and its transverse element 24 forms one of the bars of the frame.

The rigid frame 26 is itself suspended from the substrate via four beams 28 able to deform by flexion along direction X. Two beams 28 are connected to the transverse element 24 and are parallel thereto, and two beams are connected to frame member 30 parallel to the transverse element 24. The four beams 28 form means for guiding the frame in translation along direction X and thereby the transverse element 24 and hence the free end 4.1 of the membrane.

The first mobile element 8 is arranged between the two actuators A1, more particularly between member 30 of the frame 26 surrounding membrane 4 and a frame member surrounding membrane 104, these members being perpendicular to the frame members connected to the beams 28.

The first mobile element 8 is connected to frame member 30 via two beams extending along axis X and parallel to frame member 30. The first mobile element 8 is also connected to the frame member surrounding membrane 104 via two beams extending along axis X.

The second mobile element 18 is formed by a rectangular frame surrounding both actuators. The end 8.1 of the first mobile element 8 is mechanically linked to the second mobile element 18 at an inner surface of a frame member of the second mobile element 18 perpendicular to direction X and positioned on the side of the free ends of the membranes 4, 104. The end 8.1 of the first mobile element 8 is mechanically linked to the second mobile element 18 via two beams 32 perpendicular to axis X and deformable by flexion.

The second mobile element 18 is guided in translation in direction Y by means of four beams 34, one pair of beams 34 parallel to axis X connects a frame member 36 of the second mobile element 18 to the substrate, frame member 36 being parallel to axis X, and one pair of beams 34 parallel to axis X connects a frame member 38 of the mobile element to the substrate, frame member 38 being parallel to axis X. The beams 34 are deformable by flexion. The second mobile element 18 is suspended relative to the substrate via the beams 34.

The actuator A2 can be fabricated using microelectronic techniques by depositing of layers and etching.

Figure 8A:
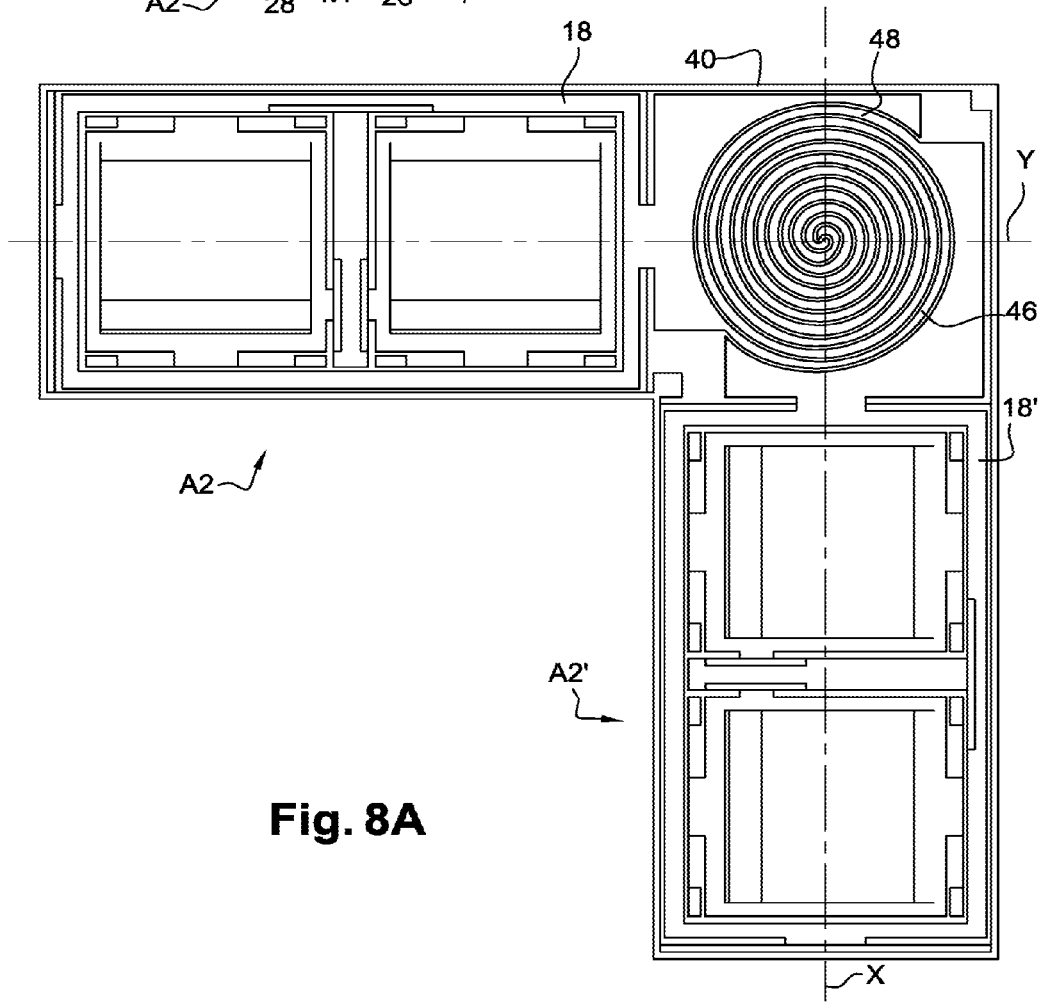
FIGS. 8A and 8B are overhead and underside views of an example of compressor using the devices in FIG. 7.
Figure 8B:
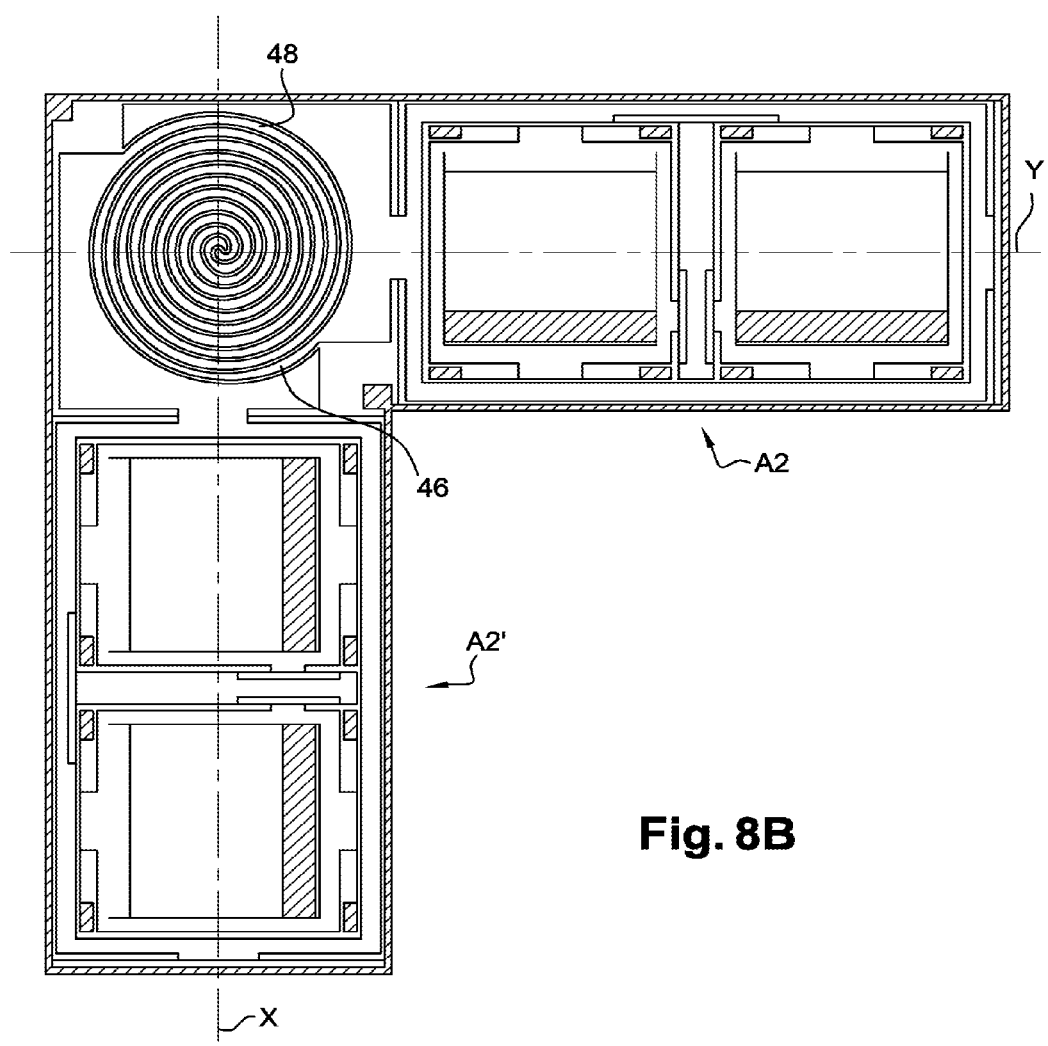

In FIGS. 8A and 8B an example of a fluid e.g. gas compressor can be seen using two actuators of the type illustrated in FIG. 6, one designated A2 and the other A2'. The compressed fluid may be of any kind e.g. air, isobutane . . . .

The compressor comprises a sealed chamber 40 containing a low pressure fluid inlet and high pressure fluid outlet (not illustrated).

Between the inlet and outlet, the compressor comprises a compression region having two coil-shaped arms 46, 48 imbricated one in the other and mobile relative to one another. They are conformed and hinged so that on account of their relative displacement one or more pockets of fluid are moved in decreasing volume between the arms in the direction of the outlet.

Each coil comprises at least one turn, even several turns to define several fluid pockets. Numerous shapes of different coils are possible for the arms 46 and 48. For example these may be a circle involute or Archimedean spiral.

Each arm is mechanically linked to an actuator, arm 46 is rigidly linked to actuator A2 and arm 48 is rigidly linked to actuator A2'.

In the illustrated example, arm 46 and the second mobile element 18 are formed of a single piece, and arm 48 and the second mobile element 18' are formed of a single piece.

Both actuators are oriented relative to one another so that the translational movements they generate are perpendicular. Therefore the second mobile element 18 of actuator A2 and arm 46 move along direction Y, and the second mobile element 18' of actuator A2' and arm 48 move along direction X.

Both arms 46 and 48 are advantageously formed by etching in one same layer.

By energizing the two actuators with signals S1 and S2, the second mobile elements 18 and 18' have translational oscillating movement in directions Y and X respectively. The arms 46 and 48 therefore have relative oscillating movement which causes displacement of the fluid pockets and compression thereof, this compressed fluid being recovered at the outlet.

Said microprocessor can be fabricated using microelectronic techniques and can be used to cool an electronic component by compressing a fluid e.g. isobutane and producing a compression/expansion cycle known as a Carnot cycle.

As a variant, a compressor could be envisaged only comprising one actuator A2 displacing a single piston in translation inside a cavity so as to compress the fluid.

Solely as an example, the following dimensions are given of the compression part of the compressor.

The surface area of the compressor is 125 mm$^2$.

The surface area of the piezoelectric deposit on the actuator membranes is 31 mm$^2$.

The initial volume Vi=0.5151 mm$^2$×0.5 mm=0.258 mm$^3$, 0.5 mm being the height of the compression zone.

The final volume Vf=0.0644 mm$^2$×0.5 mm=0.0322 mm$^3$.

The compression ratio is: 0.5151/0.0644=8.1.

The capacity of the compressor is Vf−Vi=0.258−0.0322=0.226 mm$^3$.

An example will now be given of the sizing of the actuation part used to cool by 50° C. an electric component which dissipates 200 mW. The compressor uses isobutane. The isobutane is compressed to reach a pressure difference ΔP=3 bars. For example considering a flow rate of 10.26 μmol/inlet pressure $P_{in}$=1 bar at $T_{in}$=273 K and outlet pressure $P_{out}$=4 bars.

Knowing the molar mass of isobutane: 58.12 g/mol, a mass flow is obtained of:

$$\dot{m}=5.963 \cdot 10^{-4} \text{ g/s}$$

The power absorbed by the isobutane is 7030 mW.

If an operating frequency is considered of f=5 kHz, the energy per turn to compress the fluid is 14.10 μJ.

If motion amplification is considered of: 7/2=3.5

The mechanical work Wmech is 14 μJ=1.4×10$^{-5}$ J

Bearing in mind that the coefficient of mechanical/electrical conversion is 1%, the electrical work: Welec=100 Wmech=1.4×10$^3$ J However, a thin layer PZT deposit (∈r=1300) is a capacitor and its electrical work also equals:

$$W_{elec} = \frac{1}{2}CV^2$$

That is a capacitance $$C = \frac{2 \cdot W_{elec}}{V^2},$$

i.e. 1120 nF at 50V, 280 nF at 100V, 100V being the breakdown voltage of 2 μm of PZT.

Therefore for actuation at 100V, the surface area needed to obtain a capacitance of 280 nF is 0.4865 cm$^2$ (48.65 mm$^2$), i.e. a square with sides of 7 mm.

An example is now described of a process to fabricate a device of the invention using microelectronic and nanoelectronic techniques with reference to FIGS. 9A to 9J. The fabricated device is a MEMS and/or NEMS device.

Figure 9A:
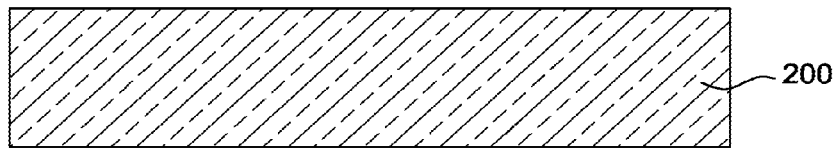
FIGS. 9A to 9J are schematic illustrations of different steps in the fabrication of a motion conversion device.

The starting material is a substrate 200, illustrated in FIG. 9A, in semiconductor material for example e.g. silicon having a thickness of 550 μm for example. At a following step, a layer 202 of $SiO_2$ is formed by deposit. The thickness of layer 202 is 1 μm for example, and on layer 202 a layer 204 of amorphous silicon is formed e.g. by deposit. The thickness of layer 204 is between 2 μm and 4 μm for example.

Figure 9B:
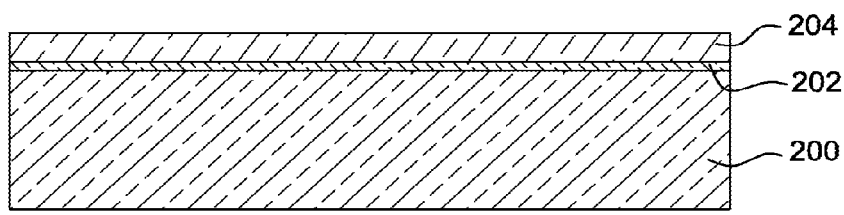

The element obtained is illustrated in FIG. 9B.

At a following step, on layer 204 a layer 206 is formed of $SiO_2$ e.g. by deposit. The thickness of layer 206 is 250 nm for example. Annealing is then conducted at 800° C. e.g. for 3 h under $O_2$.

Figure 9C:
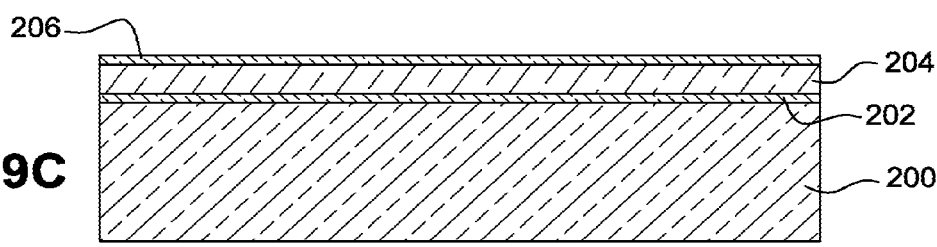

The element obtained is illustrated in FIG. 9C.

At a following step, the element in FIG. 9B is flipped over. An oxide layer 208 is formed on the back surface at 240° C.

A photolithography and an etching of Layer 208 is then carried out.

A stripping step may be carried out.

Figure 9D:
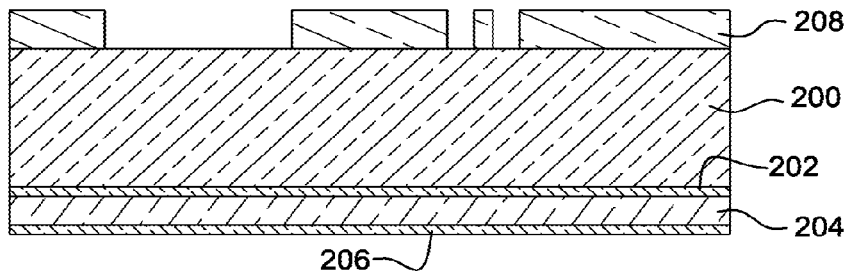

The element obtained is illustrated in FIG. 9D.

The element in FIG. 9D is again flipped over and a platinum layer 210 is formed on layer 206, e.g. by deposit. The thickness of layer 210 is 100 nm for example.

Figure 9E:
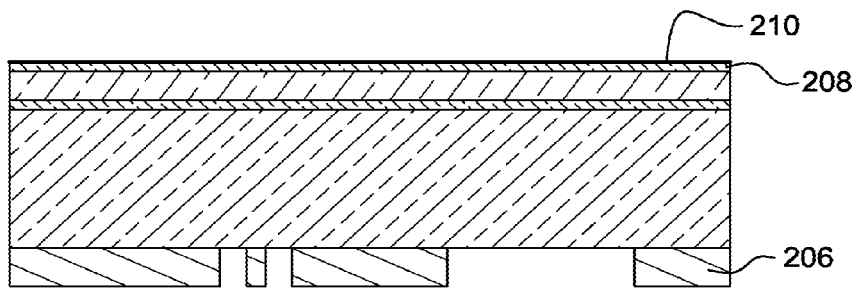

The element obtained is illustrated in FIG. 9E.

At a following step, a PZT layer 212 is formed on layer 210. For example PZT obtained using a sol-gel method is applied to layer 210 over a thickness of 350 nm for example.

The element is then annealed, for example for 1 min at 700° C. under $O_2$.

Next a Ruthenium layer 214 is formed e.g. by deposit. For example the thickness of the layer is 100 nm.

Figure 9F:
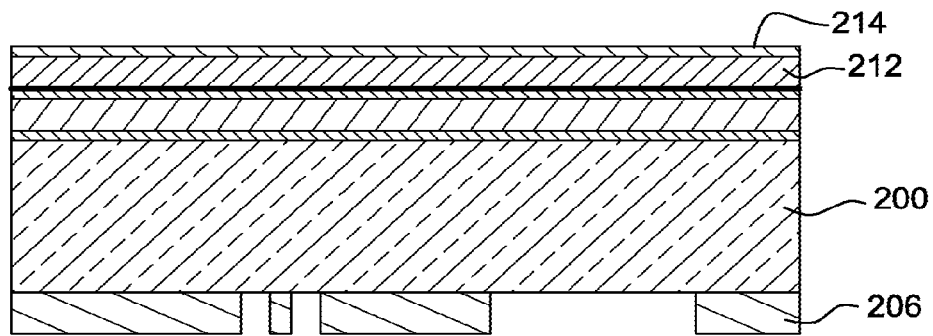

The resulting element is illustrated in FIG. 9F.

At a following step, photolithography of the Ruthenium layer 214 is conducted and etching e.g. over its entire thickness to delimit a surface substantially corresponding to that of the actuator membrane.

This can be followed by a stripping step.

Figure 9G:
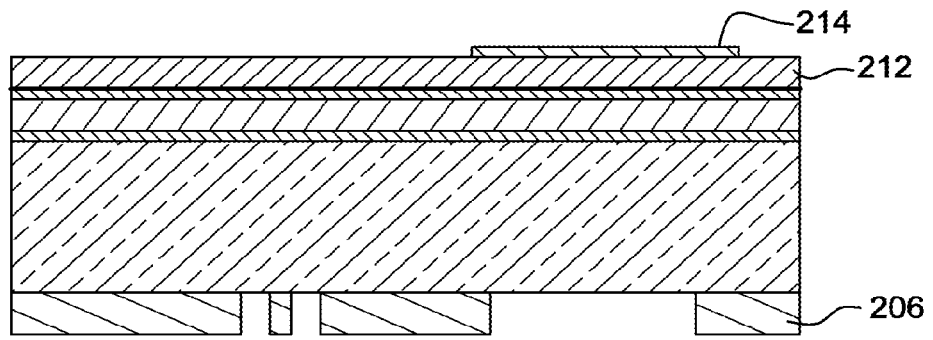

The element obtained is illustrated in FIG. 9G.

At a following step, layers 204, 206, 210, 212 and 214 are etched which will form the membrane.

Photolithography is performed to define the region to be etched.

Layer 212 is then etched e.g. by ion milling.

This is followed by etching of layer 210 e.g. by ion milling.

Etching of layers 204 and 206 follows thereafter e.g. by ion milling.

A stripping step may subsequently be applied.

Figure 9H:
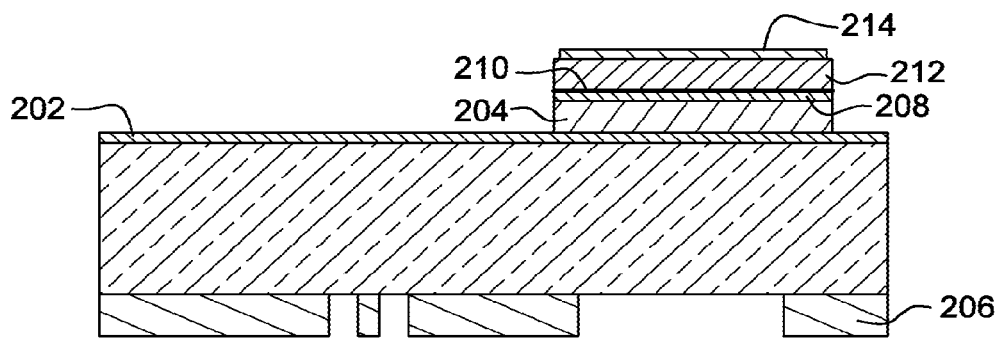

The element obtained is illustrated in FIG. 9H.

At a following step, a protective element is placed in position, for example a dry protective film e.g. by laminating.

In the illustrated example a substrate 216 e.g. in silicon or glass is bonded that has previously been etched to contain a cavity 218 at membrane level.

An element with substrate 216 is flipped over

The silicon is etched by ion milling the substrate 200 until the oxide layer 202 is reached to form the membrane, the guide beams and different mobile parts of the MEMS.

Figure 9I:
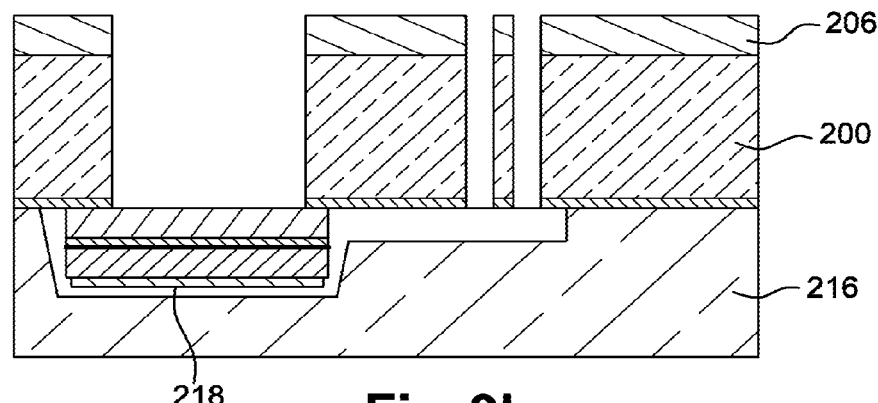

The element obtained is illustrated in FIG. 9I.

At a following step, the oxide layer 202 is etched to release the membrane 4, beams and mobile parts of the MEMS.

If a dry film has been applied, this is removed by stripping for example.

Figure 9J:
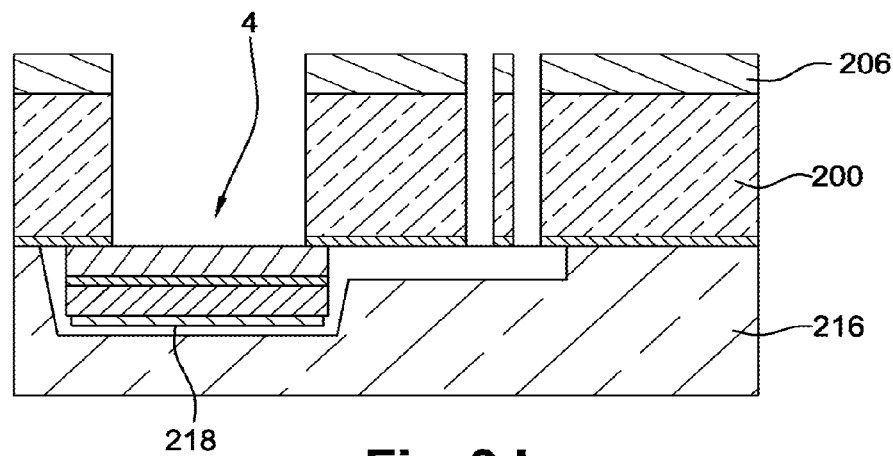

The element obtained is illustrated in FIG. 9J.

Preferably a substrate (not illustrated) is bonded onto layer 208.

The invention claimed is:

1. A system comprising:
   at least two conversion devices to convert out-of-plane motion to in-plane motion and/or conversely, each conversion device comprising:
   at least a first out-of-plane deformable element, said deformable element comprising a first fixed end anchored on a substrate and a second free end relative to the substrate,
   at least one first guide for guiding the second free end in in-plane translation,
   the first deformable element of each device being capable of deforming out-of-plane through application of an independent stimulus so that the second free end draws closer to the first fixed end by in-plane translational movement; and
   a single rotationally mobile element mobile in rotation about a rotational axis orthogonal to a plane of the system, the rotationally mobile element being fixed to the second free end of each conversion device, and the first fixed end and the second free end of each conversion device being contained within the plane.

2. The system according to claim 1, wherein the two second free ends are guided along a first direction and wherein the rotationally mobile element is mechanically linked to the second free ends of the two deformable elements of said devices.

3. The system according to claim 1, wherein the free end of one of the devices is guided along the first direction whilst the second free end of the other of the devices is guided along another direction contained in said plane and non-collinear with the first direction, and wherein the rotationally mobile element is mechanically linked to the free ends of the deformable elements of said devices.

4. The system according to claim 1, including means to apply a stimulus to each first and second deformable element without contact.

5. The system according to claim 1, wherein the first deformable element is a membrane.

6. The system according to claim 1, wherein the at least one first guide comprises deformable beams extending perpendicular to the first direction.

7. The system according to claim 1, wherein the first deformable element is a bimetallic element and the stimulus is the application of heat.

8. The system according to claim 1, wherein the first deformable element comprises a deposit of electroactive material and the stimulus is application of an electric field to said deposit.

9. The system according to claim 8, wherein the electroactive material is a piezoelectric material and the electric field is generated by electrodes arranged either side of and/or co-planar with said deposit of piezoelectric material.

10. The system according to claim 1, wherein the rotationally mobile element is mechanically linked to the free ends of the deformable elements via flexible beams.

11. The system according to claim 1, comprising an in-plane translationally mobile element mechanically linked to the rotationally mobile element so that rotation of the rotationally mobile element causes in-plane translation of the translationally mobile element.

12. The system according to claim 11, including at least one second guide for guiding the translationally mobile element in in-plane translation.

13. The system according to claim 12, wherein the at least one second guide guides in translation the translationally mobile element in a direction orthogonal to the first direction.

14. The system according to claim 11, wherein the rotationally mobile element is mechanically linked to the translationally mobile element via flexible beams.

15. The system according to claim 11, wherein the rotationally mobile element is positioned between the two deformable elements and the translationally mobile element is in the form of a frame surrounding the two deformable elements, the rotationally mobile element being hinged on an inner edge of the frame-shaped, translationally mobile element.

16. An actuator comprising at least one system according to claim 1, and a control unit sending a stimulus to each of the devices.

17. An actuator comprising at least one system according to claim 1, and a control unit sending a stimulus to each of the devices, the stimuli being phase-shifted by $\pi$.

18. A translational actuator comprising at least one system according to claim 1, and a control unit sending a stimulus to each of the devices, the actuator being an actuator in translation.

19. The actuator according to claim 18, wherein the actuator is a translational actuator and wherein the stimulus is sinusoidal.

20. A compressor, comprising:
a cavity;
first and second pistons mobile inside the cavity; and
at least two translational actuators according to claim 19, each of the pistons being mechanically linked to a translationally mobile element so that the relative displacement of the pistons generates a pressure increase in the cavity.

21. The compressor according to claim 20, wherein the first and second pistons have a spiral conformation and are imbricated one in the other to create pockets of fluid between the turns.

22. An energy recovery system comprising an energy recovery device having at least one system according to claim 1, and a unit collecting the electric current generated by said system.

23. The energy recovery system according to claim 22, wherein the first deformable element comprises a deposit of electroactive material which generates an electric current when it is deformed, advantageously a deposit of piezoelectric material.

* * * * *